US010615850B2

(12) United States Patent
Motoyama et al.

(10) Patent No.: US 10,615,850 B2
(45) Date of Patent: Apr. 7, 2020

(54) LAYERED SEMICONDUCTOR DEVICE AND DATA COMMUNICATION METHOD

(71) Applicant: UltraMemory Inc., Tokyo (JP)

(72) Inventors: Yuji Motoyama, Tokyo (JP); Takao Adachi, Tokyo (JP)

(73) Assignee: ULTRAMEMORY INC., Tokyo (JP)

( * ) Notice: Subject to any disclaimer, the term of this patent is extended or adjusted under 35 U.S.C. 154(b) by 0 days.

(21) Appl. No.: 15/999,786

(22) PCT Filed: Feb. 18, 2016

(86) PCT No.: PCT/JP2016/054666
§ 371 (c)(1),
(2) Date: Aug. 20, 2018

(87) PCT Pub. No.: WO2017/141390
PCT Pub. Date: Aug. 24, 2017

(65) Prior Publication Data
US 2019/0349029 A1 Nov. 14, 2019

(51) Int. Cl.
*H04B 5/02* (2006.01)
*H04B 5/00* (2006.01)
(Continued)

(52) U.S. Cl.
CPC .......... *H04B 5/02* (2013.01); *H01L 25/0657* (2013.01); *H04B 5/0081* (2013.01); *G11C 11/4076* (2013.01); *H01L 2225/06531* (2013.01)

(58) Field of Classification Search
CPC combination set(s) only.
See application file for complete search history.

(56) References Cited

U.S. PATENT DOCUMENTS 5,424,527 A * 6/1995 Takahira .......... G06K 19/07749
235/492
5,949,826 A * 9/1999 Iiyama ................ H04L 27/2334
332/102
(Continued)

FOREIGN PATENT DOCUMENTS

JP   H06-029885 A    2/1992
JP   H0629885 A  *  2/1994  ............... H04B 5/00
(Continued)

OTHER PUBLICATIONS

Endo Hirobumi; JPH0629885A Translation; Feb. 1994 (Year: 1994).*

*Primary Examiner* — Yuwen Pan
*Assistant Examiner* — Erica L Fleming-Hall
(74) *Attorney, Agent, or Firm* — Muncy, Geissler, Olds & Lowe, P.C.

(57) ABSTRACT

The objective of the invention is to provide technology allowing data taking a plurality of values to be transmitted and received using one set of coils when sending data through TCI technology using magnetic field coupling. This layered semiconductor device has at least a first semiconductor chip and a second semiconductor chip layered therein, the first semiconductor chip transmitting data in a contactless manner, and the second semiconductor chip receiving, in a contactless manner, the data that has been transmitted. The first semiconductor chip contains: a transmission unit outputting a transmission signal that may acquire, on the basis of the value of the data to be sent, at least 3 types of states representing the value of the data; and a transmission coil converting the transmission signal into a magnetic field signal. The second semiconductor chip contains: a reception coil whereby the magnetic field signal converted by the transmission coil is converted into a reception signal; and a reception unit reconstructing, on the (Continued)

basis of the state of the reception signal, the data that has been transmitted.

6 Claims, 9 Drawing Sheets

(51) Int. Cl.
  *H01L 25/065* (2006.01)
  *G11C 11/4076* (2006.01)

(56) References Cited

U.S. PATENT DOCUMENTS

| | | | |
|---|---|---|---|
| 6,105,874 A * | 8/2000 | Berger | G06K 19/07769 |
| | | | 235/380 |
| 9,928,460 B1 * | 3/2018 | Nowatzyk | G06N 3/04 |
| 2003/0007384 A1 | 1/2003 | Shimizu | |
| 2005/0007237 A1 * | 1/2005 | Meyer | G06K 7/0008 |
| | | | 340/10.1 |
| 2006/0081717 A1 * | 4/2006 | Berger | G06K 19/0701 |
| | | | 235/492 |
| 2009/0021974 A1 * | 1/2009 | Nonomura | H01L 23/48 |
| | | | 365/63 |
| 2010/0091537 A1 * | 4/2010 | Best | G11C 11/406 |
| | | | 365/51 |
| 2011/0011939 A1 * | 1/2011 | Seah | G06K 19/07749 |
| | | | 235/492 |
| 2012/0007438 A1 * | 1/2012 | Kuroda | H04L 25/0266 |
| | | | 307/104 |
| 2017/0271927 A1 * | 9/2017 | Sakata | H04B 5/02 |
| 2019/0065937 A1 * | 2/2019 | Nowatzyk | G06N 3/063 |
| 2019/0089414 A1 * | 3/2019 | Gree | H04B 5/0031 |

FOREIGN PATENT DOCUMENTS

| | | |
|---|---|---|
| JP | H08-149054 A | 6/1996 |
| JP | 2003-022687 A | 1/2003 |
| JP | 2007-287254 A | 11/2007 |
| JP | 2009-026792 A | 2/2009 |

* cited by examiner

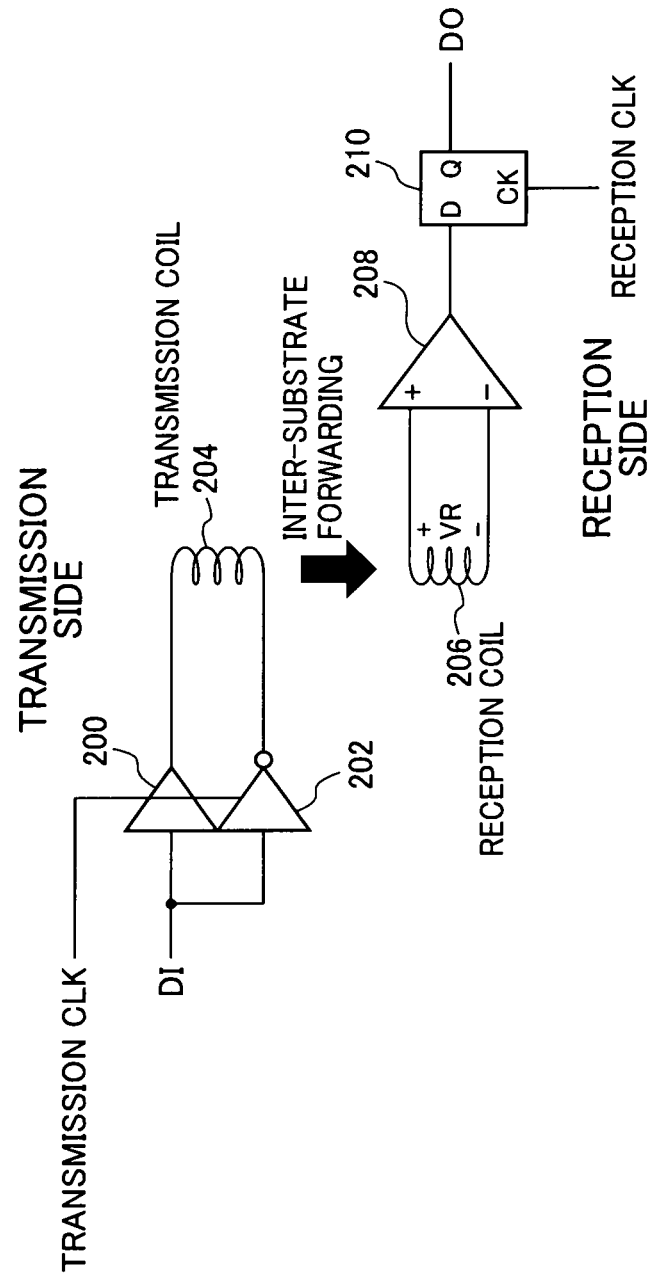

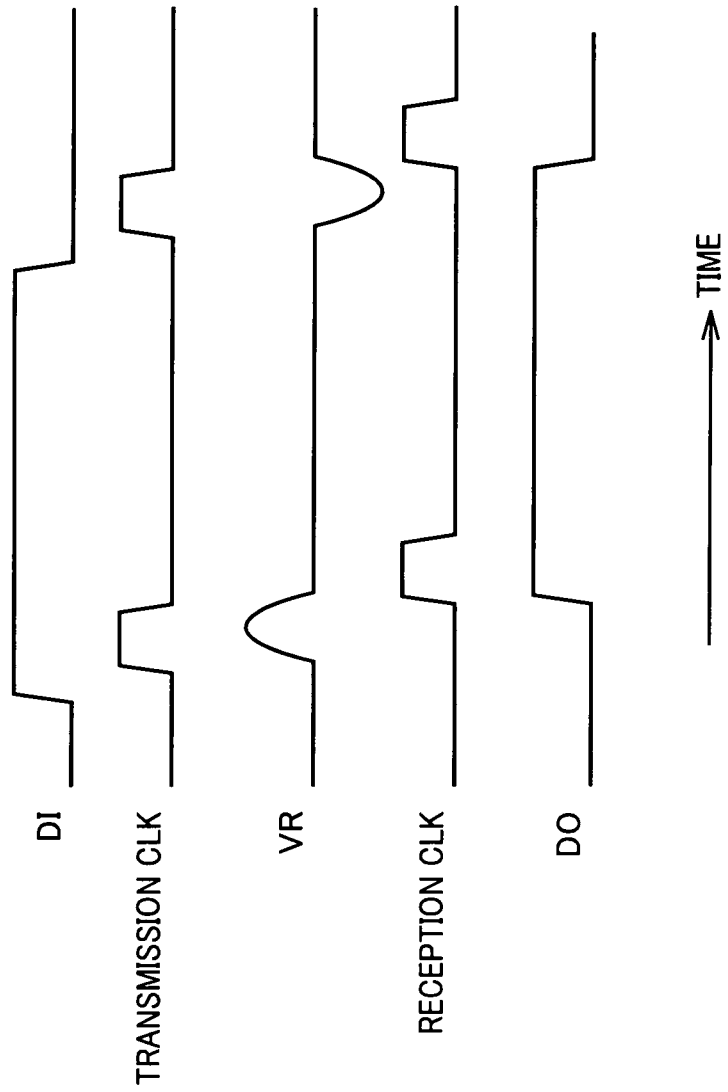

LAYERED SEMICONDUCTOR DEVICE AND DATA COMMUNICATION METHOD

TECHNICAL FIELD

The present invention relates to a layered semiconductor device. Particularly, the invention relates to a layered semiconductor device that employs a data communication method capable of communicating multi-value data between semiconductor chips in the layered semiconductor device constructed by stacking the semiconductor chips. In addition, the invention relates to a data communication method capable of communicating multi-value data between semiconductor chips, and a semiconductor device that employs the data communication method.

BACKGROUND ART

Progress of capacity enlargement of a dynamic random access memory (DRAM) is significant. Particularly, recently, a layered DRAM in which a plurality of memory chips are stacked is suggested, and capacity enlargement is in progress. A layered semiconductor device in which a plurality of semiconductor chips are stacked can improve the degree of integration per area of the semiconductor device, and is widely used without limitation to the DRAM.

In the layered semiconductor device in which a plurality of semiconductor chips (for example, memory chips) are stacked as described above, a ThruChip interface (TCI) technology is known as a data transmission and reception method between semiconductor chips. The TCI technology is a general name of a technology of performing communication between semiconductor chips in a contactless manner. For example, a coil is provided each of the semiconductor chips, and data transmission between the semiconductor chips can be performed by magnetic field coupling between coils.

Hereinafter, as the TCI technology, description will be given of an example in which magnetic field coupling using a coil is used. FIG. 8 illustrates a configuration view illustrating a circuit configuration in which data transmission between semiconductor chips is performed by using the conventional TCI technology Here, a communication technology for carrying out data transmission between semiconductor chips is referred to as inter-substrate communication.

In FIG. 8, a transmission side represents a configuration on a semiconductor chip on a data transmission side, and a reception side represents a configuration on another semiconductor chip on a data reception side. In FIG. 8, a transmission side and a reception side which correspond to one piece of data DI are illustrated. The data DI stated here is data on one digital data line, and can take a value of "1" or In FIG. 8, the data DI is input to a non-inverting transmission amplifier 200 and an inverting transmission amplifier 202. A transmission coil 204 is connected between an output terminal of the non-inverting transmission amplifier 200 and an output terminal of the inverting transmission amplifier 202. Due to the connection, in a case where the data D1 is "1", a positive-phase voltage is applied to the transmission coil 204, and a positive-phase magnetic field is generated. Here, it is assumed that the positive-phase magnetic field represents a magnetic field in a direction indicated by an arrow in FIG. 8. On the other hand, in a case where the data D1 is "0", a reversed-phase voltage is applied to the transmission coil 204, and a reversed-phase magnetic field is generated. It is assumed that the reversed-phase magnetic field represents a magnetic field in a direction opposite to the arrow illustrated in FIG. 8.

In addition, transmission CLK that is a transmission clock signal is applied to the non-inverting transmission amplifier 200 and the inverting transmission amplifier 202, and each of the amplifiers operates only in a case where the transmission CLK is "1". In addition, in a case where the transmission CLK is "0", the output terminals of the respective amplifiers enter a "0" or high-impedance state in combination, a current does not flow to the transmission coil, and a magnetic field is not generated. As described above, the transmission side (semiconductor chip thereof) includes the non-inverting transmission amplifier 200, the inverting transmission amplifier 202, and the transmission coil 204.

In FIG. 8, when a current flows to the transmission coil 204 on the transmission side, the same current VR (in an opposite direction) also flows to a reception coil 206 due to magnetic field coupling (electromagnetic induction). In principle, the current VR is a current that is equivalent to the current that flows to the transmission coil 204 on the transmission side, and is a current with the same magnitude.

The current VR that flows to the reception coil 206 is input to the sense amplifier 208. An amplification rate of the sense amplifier 208 is set to a sufficiently large value, and an output signal thereof becomes a digital signal of "1" or "0" in correspondence with a direction of the current VR. A flip-flop 210 latches the output signal of the sense amplifier 208 in synchronization with a reception CLK that is a reception clock, and outputs the latched signal to a data line DO that outputs received data. As described above, the reception side (semiconductor chip thereof) includes the reception coil 206, the sense amplifier 208, and the flip-flop 210. According to the above-described configuration, data (data to be transmitted) of a data line DI on the transmission side is transmitted to the reception side through inter-substrate transmission using the transmission coil 204 and the reception coil 206, and is output from the data line DO.

Description by Time Chart

A time chart of a signal on the transmission side and the reception side in FIG. 8 is illustrated in FIG. 9. In FIG. 9, DI represents data that is a signal on the data line DI and data to be transmitted. In FIG. 9, the transmission CLK represents a transmission clock, and VR is a current value of the reception coil 206 and is substantially equivalent to a voltage of the reception coil 206. In addition, the VR is substantially equivalent to a current and a voltage of the transmission coil 204. In addition, in FIG. 9, DO represents data that is received on the reception side, and represents data on the data line DO. In addition, in FIG. 9, it is assumed that time passes from the left to the right.

First. In a state in which the DI is "1", one pulse occurs in the transmission CLK, a current in a direction corresponding to the state of DI flows to the transmission coil 204 during the one pulse. A current that is substantially the same as the current is indicated by VR in FIG. 9. In the example of FIG. 9, when the transmission CLK appears by one clock in a state in which the DI is "1", it enters a state in which the VR flows in a positive direction in correspondence with the appearance.

On the reception side, the VR that appears in the reception coil 206 is amplified by the sense amplifier 208. In a case where the VR is equal to or greater than a predetermined threshold value, a signal that becomes "1" is output, and in a case where the VR is less than the threshold value, a signal that becomes "0" is output. As illustrated in FIG. 9, the reception CLK is a clock of which rising is slightly delayed in comparison to the one pulse of the transmission CLK. On the reception side, at the rising of the reception CLK, the flip-flop 210 latches an output signal of the sense amplifier 208, and outputs the latched signal as DO. The example of FIG. 9 illustrates a state in which in a case where the DI is "1", at the rising of the reception CLK, the DO varies to "1".

In FIG. 9, a case where the DI is "0" is also illustrated as in a case where the DI is "1". In a case where the DI is "0", as illustrated in FIG. 9, a current direction of the VR is a negative direction. As a result, an output signal of the sense amplifier 208 becomes "0", and thus the flip-flop 210 latches "0", and the DO becomes "0". As described above, data that is output from the transmission side is received on the reception side.

Here, the transmission CLK is transmitted from the transmission side to the reception side by using an additional TCI technology and the like, and is used on the reception side as the reception CLK. As a result, as illustrated in FIG. 9, the reception CLK becomes a clock that is slightly delayed in comparison to the transmission CLK.

The clock signal is transmitted from a semiconductor chip on the transmission side, from which data is transmitted, to a semiconductor chip on the reception side that receives data by the TCI technology. A view illustrating this state is shown in FIG. 4. FIG. 4 is a view illustrating a stacking example of semiconductor chips of a layered semiconductor storage device, and a state in which a coil is provided on each of the semiconductor chips, and a clock signal is transmitted by a magnetic field coupling using the coil.

FIG. 4(a) illustrates a state in which the transmission CLK is transmitted from an active interposer A-I/P to other semiconductor chips (memory chips DRAM0 to DRAM7, and DRAMR). In addition, in contrast, FIG. 4(b) illustrates a state in which the transmission CLK is transmitted from the memory chips DRAM to the active interposer A-I/P. A configuration related to FIG. 4 will be described again later.

CITATION LIST

For example, the following Patent Document 1 discloses a nonvolatile semiconductor storage device that includes a binary memory cell space, and a multi-value memory cell space.

In addition, the following Patent Document 2 discloses an optical recording medium capable of performing multi-value recording at multi-layers. Particularly, an optical recording medium capable of performing multi-value recording of 2 bits or greater at each recording layer is disclosed.

Patent Document 1: Japanese Unexamined Patent Application (Translation of PCT Application), Publication No. 2003-22687

Patent Document 2: Japanese Unexamined Patent Application, Publication No. 2007-287254

DISCLOSURE OF THE INVENTION

Problems to be Solved by the Invention

As described above, in the TCI technology using a magnetic field coupling that is used in the conventional layered semiconductor device, in the case of transmitting and receiving one piece of data, one set of the transmission coil and the reception coil is necessary. Here, the one piece of data is data that is mainly transmitted by one data line. On the other hand, in this specification, for convenience, data that is transmitted by one data line is referred to as one piece of data.

However, in the case of performing the inter-substrate communication by the TCI technology that uses the magnetic field coupling, when performing a plurality of pieces of data communication, sets of the transmission coil and the reception coil, which correspond to the number of pieces of data, are necessary. Since the coils carry out magnetic field coupling, in principle, the coils are necessary to a certain extent, and thus miniaturization is typically difficult. When transmitting data taking a plurality of bits in parallel, an area occupied by the coil on a semiconductor chip area increases. Here, in the technology using TCI using the magnetic field coupling, when the number of coils can be reduced, it is possible to reduce an area occupied by coils on a semiconductor chip, but this technology is not known yet.

The invention has been made in consideration of the problems, and an object thereof is to provide a technology allowing data taking a plurality of values to be transmitted and received using one set of coils when performing data transmission through a TCI technology using magnetic field coupling. In other words, an object of the invention is to provide a layered semiconductor device that uses the technology, and a data communication method by the technology.

Means for Solving the Problems (1) To accomplish the object, according to an aspect of the invention, there is provided layered semiconductor device in which at least a first semiconductor chip that transmits data in a contactless manner, and a second semiconductor chip that receives the transmitted data in a contactless manner are stacked. The first semiconductor chip includes a transmission unit that outputs a transmission signal capable of taking at least three or more kinds of states indicating a value of data on a basis of the value of data to be transmitted, and a transmission coil that converts the transmission signal into a magnetic field signal. The second semiconductor chip includes a reception coil that converts the magnetic field signal converted by the transmission coil into a reception signal, and a reception unit that restores the transmitted data on a basis of a state of the reception signal.

(2) In addition, in the layered semiconductor device according to (1), the transmission unit may output the transmission signal having three or more kinds of amplitude values on a basis of the value of data to be transmitted, the transmission coil may convert the transmission signal into a magnetic field signal of three or more kinds of amplitudes based on the value of data, the reception coil may convert the magnetic field signal into a reception signal of three or more kinds of amplitudes based on the value of data, and the reception unit may restore the value of transmitted data on a basis of an amplitude value of the reception signal.

(3) In addition, in the layered semiconductor device according to (2), the transmission unit, may output the transmission signal so that the amplitude value of the reception signal becomes greater than a first threshold value in the reception unit in a case where the data to be transmitted is data of a first value, may output the transmission signal so that the amplitude value of the reception signal becomes equal to or less than the first threshold value and becomes equal to or greater than a second threshold value that is less than the first threshold value in the reception unit in a case where the data to be transmitted is data of a second value, and may output the transmission signal so that the amplitude value of the reception signal becomes less than the second threshold value in the reception unit in a case where the data to be transmitted is data of a third value.

(4) In addition, in the layered semiconductor device according to (3), the reception unit may include a first comparison unit that compares the amplitude value of the reception signal and the first threshold value with each other, a second comparison unit that compares the amplitude value of the reception signal and the second threshold value with each other, and a data restoration unit that outputs the data of the first value in a case where the first comparison unit determines that the amplitude value of the reception signal is greater than the first threshold value, outputs the data of the second value in a case where the first comparison unit determines that the amplitude value of the reception signal is equal to or less than the first threshold value and the second comparison unit determines that the amplitude value of the reception signal is equal to or greater than the second threshold value, and outputs the data of the third value in a case where the second comparison unit determines that the amplitude value of the reception signal is less than the second threshold value.

(5) In addition, to accomplish the object, according to another aspect of the invention, there is provided data communication method of transmitting data from a first semiconductor chip to a second semiconductor chip in a contactless manner in a layered semiconductor device in which at least the first semiconductor chip that transmits data in a contactless manner, and the second semiconductor chip that receives the transmitted data in a contactless manner are stacked. The method includes: an output step of outputting a transmission signal capable of taking at least three or more kinds of states indicating a value of data on a basis of the value of data to be transmitted in the first semiconductor chip; a first conversion step of converting the transmission signal into a magnetic field signal in the first semiconductor chip; a second conversion step of converting the converted magnetic field signal into a reception signal in the second semiconductor chip; and a restoration step of restoring the transmitted data on a basis of a state of the reception signal in the second semiconductor chip.

(6) In addition, in the data communication method according to (5), the transmission signal having three or more kinds of amplitude values may be output on a basis of the value of data to be transmitted in the output step, the transmission signal may be converted into a magnetic field signal of three or more kinds of amplitudes based on the value of data in the first conversion step, the magnetic field signal may be converted into a reception signal of three or more kinds of amplitudes based on the value of data in the second conversion step, and the value of the transmitted data may be restored on a basis of an amplitude value of the reception signal in the restoration step.

(7) In addition, in the data communication method according to (6), in the output step, in a case where the data to be transmitted is data of a first value, the transmission signal may be output so that the amplitude value of the reception signal becomes greater than a first threshold value in the restoration step, in a case where the data to be transmitted is data of a second value, the transmission signal may be output so that the amplitude value of the reception signal becomes equal to or less than the first threshold value and becomes equal to or greater than a second threshold value that is less than the first threshold value in the restoration step, and in a case where the data to be transmitted is data of a third value, the transmission signal may be output so that the amplitude value of the reception signal becomes less than the second threshold value in the restoration step.

(8) In addition, in the data communication method according to (7), the restoration step may include a first comparison step of comparing the amplitude value of the reception signal and the first threshold value with each other, a second comparison step of comparing the amplitude value of the reception signal and the second threshold value with each other, and a data restoration step of outputting the data of the first value in a case where it is determined that the amplitude value of the reception signal is greater than the first threshold value in the first comparison step, outputting the data of the second value in a case where it is determined that the amplitude value of the reception signal is equal to or less than the first threshold value in the first comparison step and it is determined that the amplitude value of the reception signal is equal to or greater than the second threshold value in the second comparison step, and outputting the data of the third value in a case where it is determined that the amplitude value of the reception signal is less than the second threshold value in the second comparison step.

Effects of the Invention

As described above, according to the invention, data transmission between semiconductor chips is performed by using a signal capable of taking three or more kinds of states on the basis of data to be transmitted, and thus it is possible to reduce the number of coil for data transmission.

BRIEF DESCRIPTION OF THE DRAWINGS

FIG. 8 is a configuration diagram illustrating a circuit configuration in which data transmission is performed between semiconductor chips by using a TCI technology in a conventional layered semiconductor device.

FIG. 9 is a time chart of a signal on a transmission side and on a reception side in the configuration of FIG. 8.

PREFERRED MODE FOR CARRYING OUT THE INVENTION

Hereinafter, a layered semiconductor device according to preferred embodiments of the invention will be described in detail with reference to the accompanying drawings.

Furthermore, embodiments to be described later are illustrative only as means for realizing the invention, and it should be understood that appropriate variations and modifications are made according to a configuration of a device to which the invention is applied or various conditions, and the invention is not limited to the following embodiments.

First. Embodiment 1

Configuration

Figure 1:
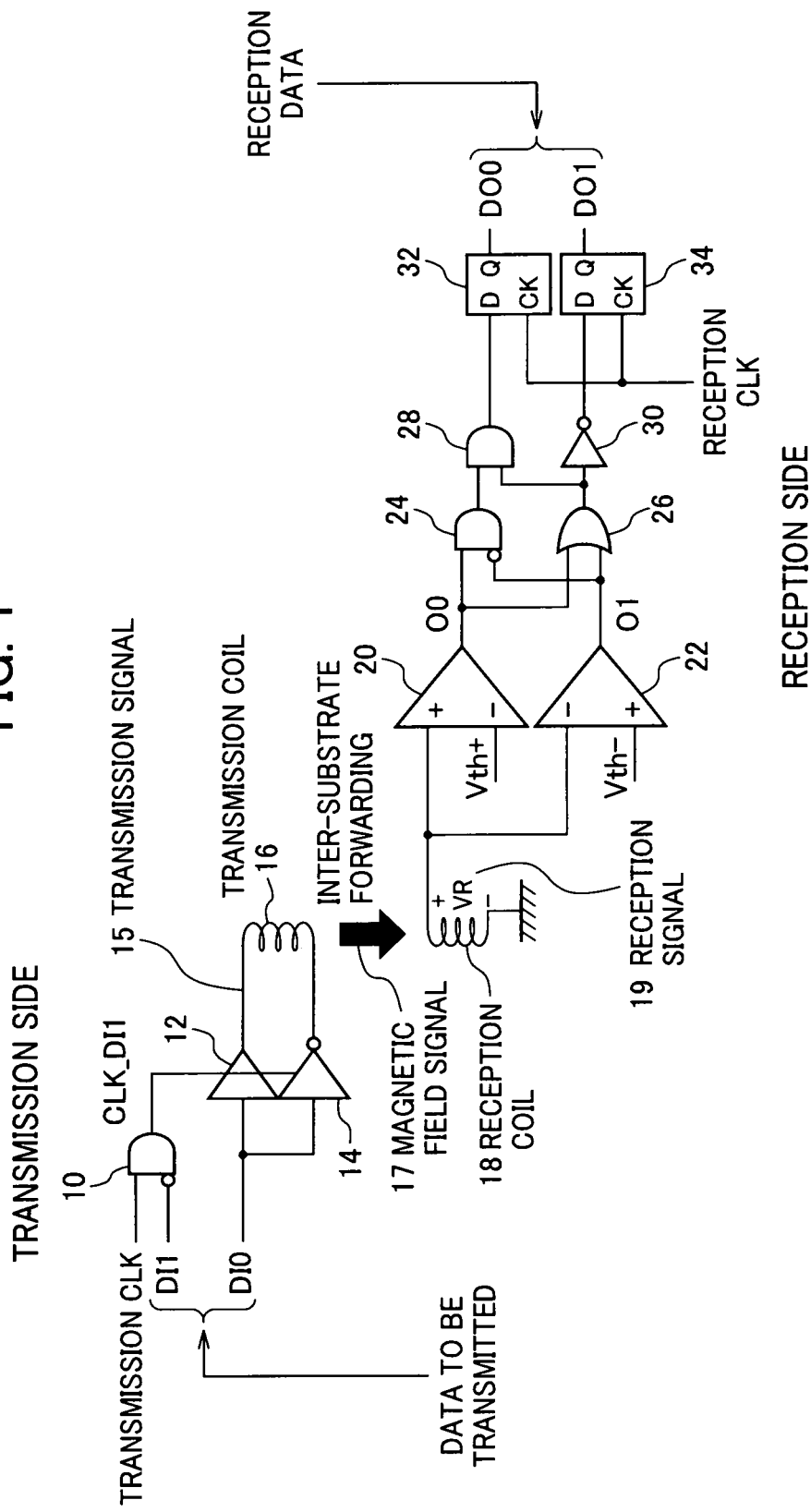
FIG. 1 is a configuration diagram illustrating a circuit configuration in which data transmission is performed between semiconductor chips by using a TCI technology in a layered semiconductor device according to Embodiment 1.

FIG. 1 is a configuration diagram illustrating a circuit configuration in which data transmission is performed between semiconductor chips in a layered semiconductor device of this embodiment. FIG. 1 corresponds to FIG. 8 that is a conventional technology.

In FIG. 1, similar to FIG. 8, a transmission side represents a configuration of a semiconductor chip on a data transmission side, and a reception side represents a configuration of another semiconductor chip on a data reception side.

Transmission Side

In FIG. 1, two pieces of data DI0 and DI1 are data to be transmitted. In this embodiment, the data DI0 is input to a non-inverting transmission amplifier 12 and an inverting transmission amplifier 14. Furthermore, a transmission coil 16 is connected between an output terminal of the non-inverting transmission amplifier 12 and an output terminal of the inverting transmission amplifier 14. Due to the connection, in a case where a data line D10 is "1", a transmission signal 15 that is a positive-phase voltage is applied to the transmission coil 16, and thus a positive-phase magnetic field is generated. The magnetic field is referred to as a magnetic field signal 17. Here, the positive-phase magnetic field represents a magnetic field in a direction indicated by an arrow in FIG. 1. On the other hand, in a case where the data D1 is "0", a transmission signal 15 that is a reversed-phase voltage is applied to the transmission coil 16, and a reversed-phase magnetic field is generated. The reversed-phase magnetic field represents a magnetic field in a direction opposite to the arrow illustrated in FIG. 1.

The data DI' and a transmission CLK are input to an AND gate 10. Furthermore, the data DI' is input to the AND gate 10 after being inverted. An output signal CLK_DI1 of the AND gate 10 is a signal obtained by gating the data DI1 with the transmission CLK, and is a signal in which the data DI1 appears only in a case where the transmission CLK is "1". In a case where the transmission CLK is "0", the output signal CLK_DI1 of the AND gate 10 always becomes "0". The CLK_DI1 is supplied to the non-inverting transmission amplifier 12 and the inverting transmission amplifier 14, and the amplifiers operate as described above only in a case where the CLK_DI1 is "1". In addition, in a case where CLK_DI1 is "0", the output terminals of the amplifiers enter a "0" or high-impedance state in combination, and a voltage is not applied to the transmission coil 16. As a result, a magnetic field is not generated.

As described above, the transmission side (semiconductor chip thereof) includes the non-inverting transmission amplifier 12, the inverting transmission amplifier 14, the transmission coil 16, and the AND gate 10. Among these, the non-inverting transmission amplifier 12, the inverting transmission amplifier 14, and the AND gate 10 corresponds to a preferred example of a "transmission unit" in the appended claims. According to the configuration, on the transmission side, in a case where the data DI1 is "0", a transmission signal 15 of a voltage in a direction corresponding to a data value of the data DI0 is applied to the transmission coil 16 in synchronization with the transmission CLK. A detailed operation will be described later with reference to FIG. 2.

Reception Side

In FIG. 1, when the transmission signal 15 is applied to the transmission coil 16 on the transmission side, the same reception signal VR19 (in an opposite direction) also flows to a reception coil 18 on the reception side due to magnetic field coupling (electromagnetic induction). In principle, the reception signal VR19 is a signal equivalent to the transmission signal 15 that is applied to the transmission coil 16 on the transmission side, and an amplitude thereof is proportional to that of the transmission signal 15.

The reception signal VR19 appears in the reception coil 18 is input to a non-inverting input terminal of a sense amplifier 20 and an inverting input terminal of a sense amplifier 22. Furthermore, a predetermined threshold voltage Vth+ is applied to the inverting input terminal of the sense amplifier 20. In addition, a predetermined threshold voltage Vth− is applied to the non-inverting input terminal of the sense amplifier 22. In addition, an amplification rate of the sense amplifiers 20 and 22 is set to a sufficiently large value. As a result, the sense amplifiers 20 and 22 substantially operate as a comparator.

Accordingly, in a case where an amplitude of the reception signal VR19 that is input to the sense amplifier 20 is greater than the threshold voltage Vth+, the sense amplifier 20 outputs "1" as an output O0, and in a case where the reception signal VR19 that is input to the sense amplifier 20 is less than the threshold voltage Vth+, the sense amplifier 20 outputs "0" as the output O0. The output O0 of the sense amplifier 20 is input to an AND gate 24 and an OR gate 26.

In a case where the reception signal VR19 (amplitude thereof) that is input to the sense amplifier 22 is greater than the threshold voltage Vth−, the sense amplifier 22 outputs "0" as an output O1, and in a case where the reception signal VR19 (amplitude thereof) that is input to the sense amplifier 22 is less than the threshold voltage Vth−, the sense amplifier 22 outputs "1" as the output O1. Furthermore, the sense amplifier 20 corresponds to a preferred example of a "first comparison unit" in the appended claims. In addition, the sense amplifier 22 corresponds to a preferred example of a "second comparison unit" in the appended claims.

The output O1 of the sense amplifier 22 is also input to the AND gate 24 and the OR gate 26. However, the output O1 of the sense amplifier 22 is input to the AND gate 24 after being inverted. An output of the AND gate 24 is input to an AND gate 28. On the other hand, an output of the OR gate 26 is input to the AND gate 28 and an inverter 30. An output signal of the AND gate 28 and an output signal of the inverter 30 are substantially received data, are latched by flip-flops 32 and 34, and are output as reception data DO0 and reception data DO1.

The flip-flop 32 is a flip-flop that latches the output signal of the AND gate 28 at reception CLK that is a reception clock, and an output signal thereof is DO0. Similarly, the flip-flop 34 is a flip-flop that latches the output signal of the inverter 30 at reception CLK, and an output signal thereof become DO1. As described above, the semiconductor chip on the reception side includes the reception coil 18, the sense amplifiers 20 and 22, the AND gate 24, the OR gate 26, the AND gate 28, the inverter 30, and the flip-flops 32 and 34. Among these, the sense amplifiers 20 and 22, the AND gate 24, the OR gate 26, the AND gate 28, the inverter 30, and the flip-flops 32 and 34 correspond to a preferred example of a "reception unit" in the appended claims. In addition, among these, the AND gates 24, the OR 26, the AND gate 28, and the inverter 30 correspond to a preferred example of a "data restoration unit" in the appended claims. However, another circuit that performs the same operation may be employed without limitation to the circuit example of FIG. 1.

According to the above-described configuration, data DI0 or DI1 to be transmitted can be received as reception data DO0 or DO1. The data DO0 or DO1 is data restored from the data to be transmitted, and is final reception data (restoration data).

Time Chart

Figure 2:
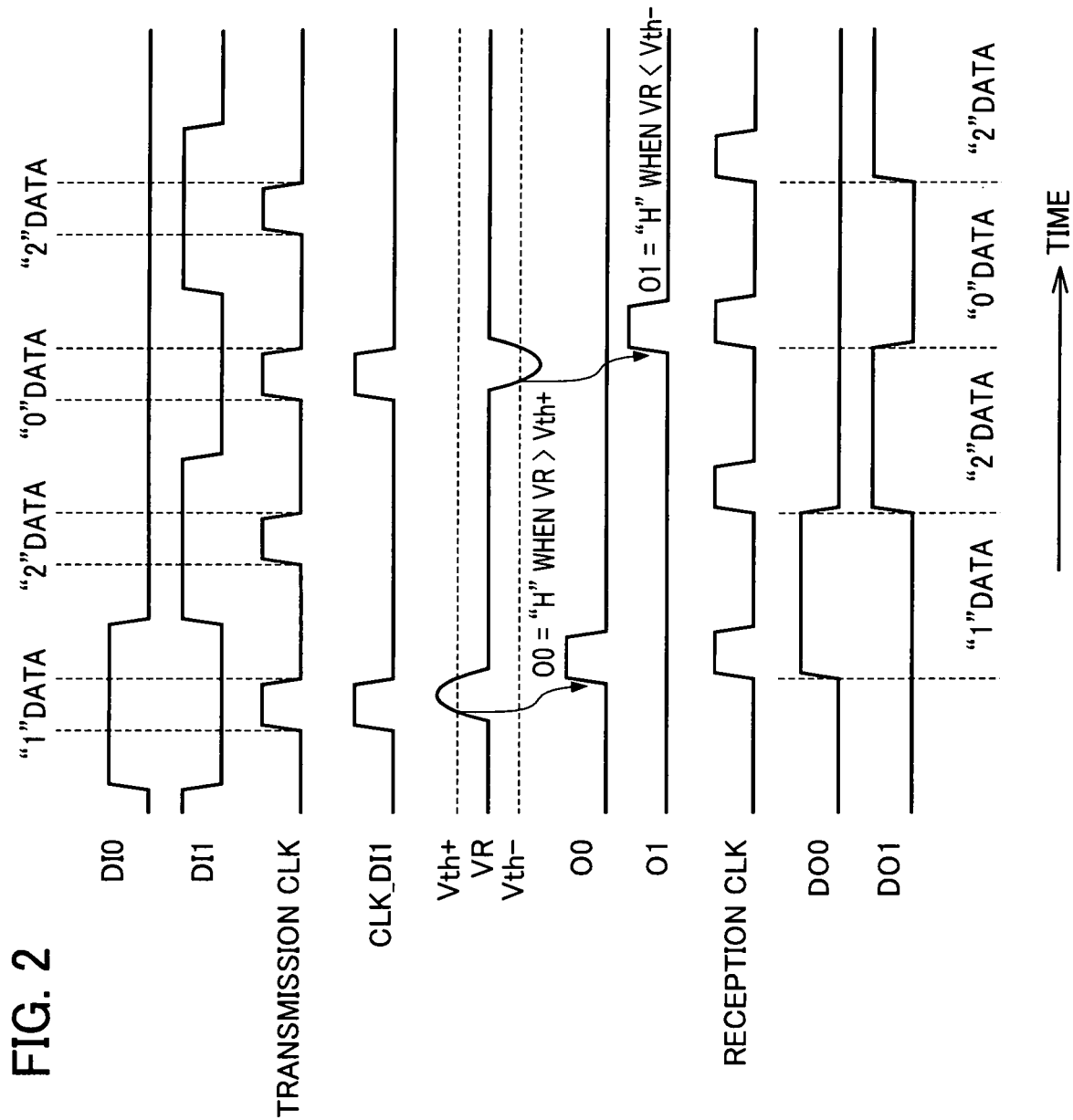
FIG. 2 is a time chart of a signal on a transmission side and on a reception side in Embodiment 1.

A time chart of the signal on the transmission side and the reception side in FIG. 1 is illustrated in FIG. 2. In FIG. 2, DI0 and DI1 represent data to be transmitted in combination. In this embodiment, "0", "1", and "2" are expressed by using DI0 and DI1. That is, {DI0=0, DI1=0} represents data of which a value is "0". In addition, {DI0=1, DI1=0} represents data of which a value is "1". In addition, {DI0=0, DI1=1} represents data of which a value is "2". Furthermore, {DI0=1, DI1=1} is not used as normal data.

FIG. 2 illustrates a state in which a value of data sequentially transitions to "1", "2", "0", and "2" with the passage of time. Transmission CLK illustrated in FIG. 2 is a clock signal that can be used for data transmission in a semiconductor chip on the transmission side, and is the transmission CLK illustrated in FIG. 1. In a period in which the transmission CLK is "1", data is recognized, and the data is transmitted to the reception side.

As described above, CLK_DI1 is a signal obtained by gating DI1 that is data to be transmitted with the transmission clock. Accordingly, in a case where the transmission CLK is "1", when DI1 is "0", the CLK_DI1 becomes "1". Accordingly, as illustrated in FIG. 2, in a case where transmission data is "1" and "0", the CLK_DI1 becomes "1". On the other hand, in a case where the transmission data is "2", the CLK_DI1 becomes "0". In a case where the CLK_DI1 is "1", and the data DO0 is "1", a voltage in a positive direction is applied to the transmission coil 16, and thus the CLK_DI1 is "1". In a case where the data DO0 is "0", the transmission signal 15 that is a voltage in an opposite direction is applied to the transmission coil 16.

That is, in a case where a value of the transmission data is "1", the transmission signal 15 that is a voltage in a positive direction is applied to the transmission coil 16, and the reception signal VR19 in the same positive direction is also generated in the reception coil 18 (refer to FIG. 2). On the other hand, in a case where the value of the transmission data is "0", the transmission signal 15 that is a voltage in an opposite direction is applied to the transmission coil 16, and the reception signal VR19 in the same opposite direction is also generated in the reception coil 18 (refer to FIG. 2).

Here, for example, the positive direction is a direction indicated by the arrow in FIG. 1 in this embodiment, but an arbitrary direction may be employed. On the other hand, in a case where the value of the transmission data is "2", a voltage is not applied to the transmission coil 16, and the amplitude of the reception signal VR of the reception coil 18 is zero. As illustrated in FIG. 2, in a case where the value of the transmission data is "1", the reception signal VR19 appears in the positive direction, and an amplitude value thereof is greater than the first threshold value Vth+. As a result, the output signal O0 of the sense amplifier 20 becomes "1", and the output signal O1 of the sense amplifier 22 becomes "0" (refer to FIG. 2).

Similarly, as illustrated in FIG. 2, in a case where the value of the transmission data is "0", the reception signal VR19 appears as a voltage in an opposite direction, and an amplitude value of the voltage becomes less than the second threshold value Vth−. As a result, the output signal O0 of the sense amplifier 20 becomes "0", and the output signal O1 of the sense amplifier 22 becomes "1" (refer to FIG. 2). In addition, in a case where the value of the transmission data is "2", the voltage of the reception signal VR19 is shown as 0 (ground potential), and the value (amplitude is zero) becomes less than the first threshold value Vth+, and greater than the second threshold value Vth−. As a result, the output signal O0 of the sense amplifier 20 becomes "0", and the output signal O1 of the sense amplifier 22 also becomes "0" (refer to FIG. 2).

Accordingly, with regard to O0 and O1 which are output signals of the two sense amplifiers 20 and 22, in the case of {O0, O1}={0, 0}, "2" is shown as the value of the transmission data. In the case of {O0, O1}={0, 1}, "0" is shown as the value of the transmission data. In the case of {O0, O1}={1, 0}, "1" is shown as the value of the transmission data.

Accordingly, O0 or O1 that is an output signal of the sense amplifier 20 or 22 can be decoded into original data that is a transmission target by using a predetermined logic circuits (the AND gates 24, the OR gate 26, the AND gate 28, and the inverter 30). Data obtained by latching the decoded signal at the reception CLK is the reception data DO0 or DO1 (obtained by restoring the transmission data).

An operation of latching the data is performed by the flip-flops 32 and 34. That is, the reception data DO0 or DO1 is latched by the flip-flop 32 or 34 and is retained therein. FIG. 2 illustrates a state in which whenever a pulse of the reception CLK is output, another data is latched, and in the same drawing, a state in which the reception data DO0 or DO1 transitions in the order of "1", "2", "0", and "2" is illustrated.

Threshold Values Vth+ and Vth−

Figure 3:
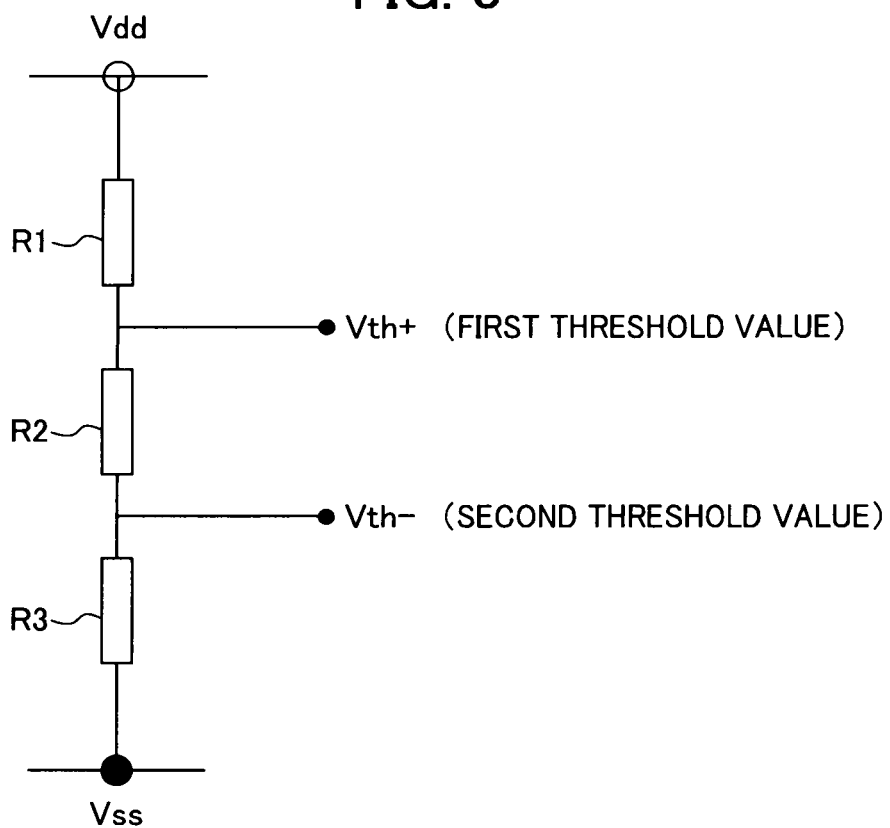
FIG. 3 is a view illustrating a threshold value setting circuit according to Embodiment 1.

FIG. 3 is a view illustrating a circuit that sets a threshold value in Embodiment 1. The first threshold value Vth+ and the second threshold value Vth− are potentials between a positive power supply Vdd and a negative power supply Vss, and in Embodiment 1, the respective threshold values are selected to establish a relationship of the first threshold value Vth+>the second threshold value Vth−. In this embodiment, as illustrated in FIG. 3, a space between the positive power supply Vdd and the negative power supply Vss is partitioned by resistors R1, R2, and R3 to create the first threshold value Vth+ and the second site Vth−. For example, the resistors R1, R2, and R3 can be set to the same resistance value. In this case, the first threshold value Vth+ is set to ⅓ Vdd, and the second threshold value Vth− is set to ⅓ Vss. Furthermore, a ground potential (GND) in Embodiment 1 is set to an intermediate potential between the positive power supply Vdd and the negative power supply Vss.

In Embodiment 1, a characteristic configuration is as follows. Specifically, two kinds of threshold values are used, and the amplitude value of the reception signal VR19 that appears in the reception coil 18 is identified by the threshold values. That is, In a case where a relationship of the amplitude of the reception signal VR19>the first threshold value Vth+ is established, the value of the transmission data (reception data) is determined as "1". In a case where a relationship of the first threshold value Vth+>the amplitude of the reception signal VR19>second threshold value Vth− is established, the value of the transmission data (reception data) is determined as "2". In a case where a relationship of the second threshold value Vth−>the reception signal VR19 is established, the value of the transmission data (reception data) is determined as "0". Under the above-described determination, the final reception data DO0 and the final reception data DO1 are obtained (refer to FIG. 2).

Furthermore, specific values of the first threshold value and the second threshold value may be adjusted in accordance with a semiconductor device to which the invention is applied. That is, values of the resistors R1, R2, and R3 can be appropriately changed. In addition, a simple resistor division example is illustrated in FIG. 3. However, to provide an accurate potential, with regard to the first threshold value Vth+ and the second threshold value Vth−, it is suitable that a buffer circuit is inserted, and the first threshold value Vth+ and the second threshold value Vth− are provided to a site in which the first threshold value Vth+ and the second threshold value Vth− are necessary through the buffer circuit.

In addition, the non-inverting transmission amplifier 12, the inverting transmission amplifier 14, and the AND gate 10 (transmission unit) output the transmission signal 15 so that the amplitude value of the reception signal 19 becomes greater than the first threshold value Vth+ in the sense amplifiers 20 and 22 in a case where data to be transmitted is "1", output the transmission signal 15 so that the amplitude value of the reception signal 19 becomes equal to or less than the first threshold value Vth+ and equal to or greater than the second threshold value Vth− that is less than the first threshold value Vth+ in the sense amplifiers 20 and 22 in a case where the data to be transmitted is "2", and outputs the transmission signal 15 so that the amplitude value of the reception signal 19 becomes less than the second threshold value Vth− in the sense amplifiers 20 and 22 in a case where the data to be transmitted is "0".

Transmission Clock and Reception Clock

The transmission CLK is a clock signal for transmitting data, and data to be transmitted is sequentially transmitted at a timing of a transmission clock in the semiconductor chip on the transmission side. The reception CLK is a clock signal for receiving data, and is a clock signal that can be used in the semiconductor chip on the reception side. Accordingly, it is necessary for the reception CLK to be subordinate to the transmission CLK.

First, the reception CLK is a clock that is synchronized with the transmission CLK. Next, it is suitable that the reception CLK is set to a clock with predetermined delay from the transmission CLK. The reception CLK is a clock that defines a data acquisition timing, but as illustrated in FIG. 2, typically, a predetermined time is taken for rising of the reception signal VR. Accordingly, it is preferable that the reception CLK has predetermined delay in comparison to the transmission CLK. In the example illustrated in FIG. 2, the reception CLK is delayed in comparison to the transmission CLK by approximately one pulse. In addition, the delay depends on a semiconductor device to which the invention is applied, and thus reasonable delay corresponding to the semiconductor device may be appropriately set.

Transmission of Clock

Figure 4:
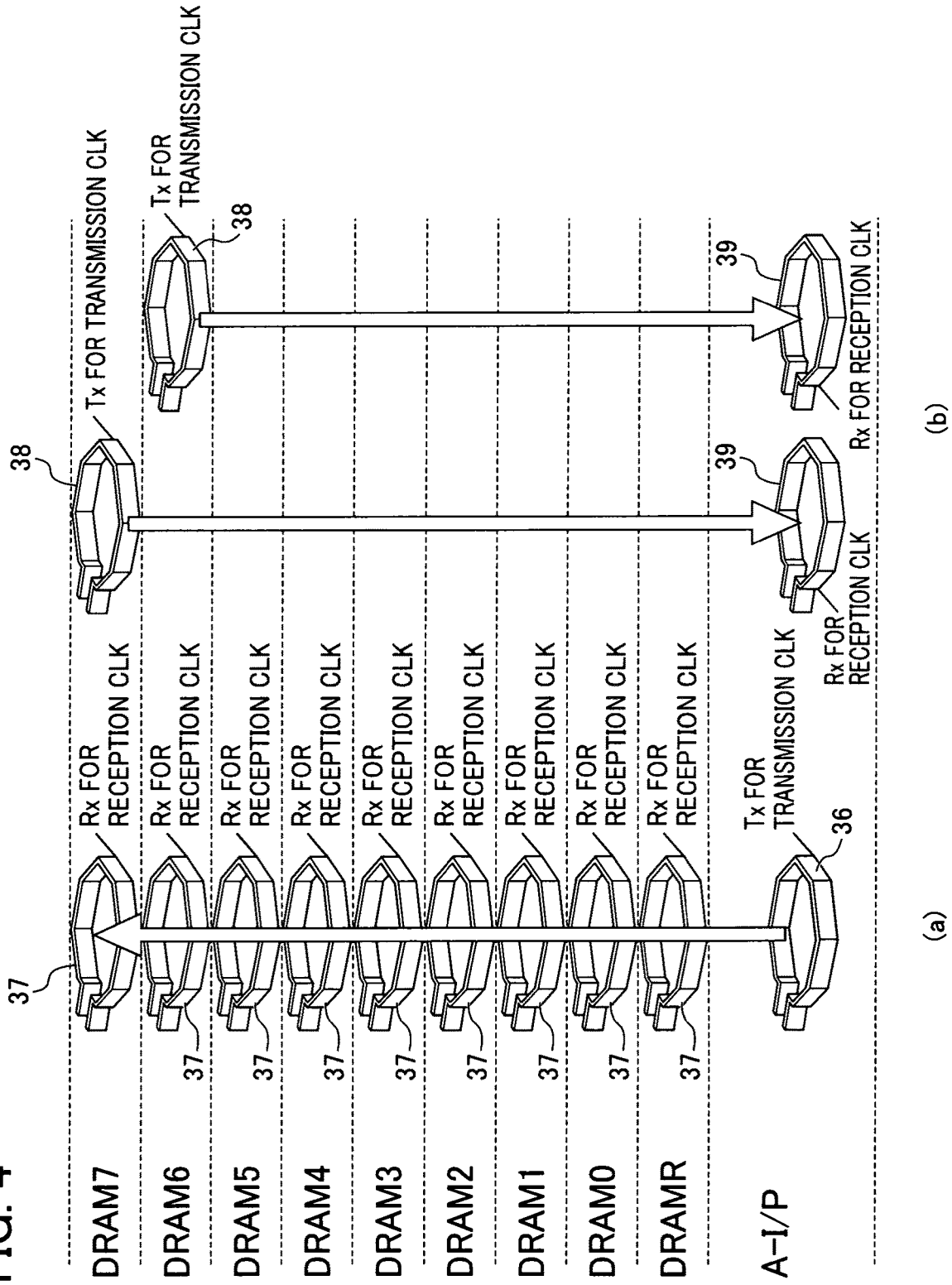
FIG. 4 is a view illustrating a clock signal transmission state between semiconductor chips of the layered semiconductor device in Embodiment 1.

Furthermore, the transmission CLK is transmitted from the semiconductor chip on the transmission side to the semiconductor chip on the reception side by using a TCI technology. In the semiconductor chip on the reception side, the reception CLK is generated by adding predetermined delay to the transmission CLK that is transmitted. FIG. 4 is a view illustrating a state in which the transmission CLK is transmitted from the semiconductor chip on the transmission side to the semiconductor chip on the reception side.

FIG. 4 is a view illustrating a transmission and reception state of a clock signal in a layered semiconductor device in which a plurality of memory chips DRAM0, DRAM1, DRAM2 to DRAM7, and DRAMR are stacked on an active interposer A-I/P. Furthermore, the stacking is realized by fusion bonding. In the stacking, other methods such as a method using an adhesive and a surface activation room-temperature bonding may be used. Here, the memory chips DRAAM0 to DRAAM7, and DRAAMR, and the active interposer A-I/P corresponds to a preferred example of the semiconductor chip. In FIG. 4, a transmission coil or a reception coil for transmission or reception of a clock signal is drawn on each semiconductor chip. The coils are basically the same coils as the transmission coil 16 and the reception coil 18 for transmission and reception of data, and the like, but are different from the transmission coil 16, the reception coil 18, and the like in that a transmission and reception target is a clock signal instead of data.

FIG. 4(a) illustrates a transmission and reception state of the clock signal in a case where the active interposer A-I/P is a semiconductor chip (first semiconductor chip) on the transmission side, and the respective memory chips DRAM0 to DRAM7, and DRAMR are semiconductor chips (second semiconductor chips) on the reception side. In this case, the active interposer A-I/P on the transmission side generates a transmission clock. The active interposer A-I/P applies the transmission clock to Tx36 for transmission CLK that is a transmission coil for the transmission CLK. On the other hand, RX37 for reception CLK that is a reception coil for receiving the transmission CLK is provided on each of the memory chips DRM0 to DRM7, and DRMR on the reception side. According to the configuration, the transmission CLK is transmitted from the transmission side to the reception side due to magnetic field coupling between the Tx36 for transmission CLK and the Rx37 for reception CLK.

After the clock signal is transmitted from the transmission side to the reception side due to the magnetic field coupling, in the reception side, necessary delay is added to the respective semiconductor chips (memory chip DRAM0, and the like) on the reception side by using a predetermined delay circuit, and finally, the clock signal is used as the reception CLK in the respective semiconductor chips on the reception side. Furthermore, as the delay that is inserted in the semiconductor chips on the reception side, different delay may be used in the respective semiconductor chips. As described above, in a case where the layered semiconductor device is a layered semiconductor storage device, and the clock signal is transmitted from the active interposer A-I/P side to the respective memory chips (for example, the DRAM chip), a timing of the transmission CLK in the active interposer A-I/P to the respective DRAM chips is the same in each case. As described above, since the transmission CLK is common, the reception CLK is generated in the respective DRAM chips on the basis of the common transmission CLK (by appropriately inserting delay).

FIG. 4(b) illustrates a transmission and reception state of the clock signal in a case where data is transmitted from the memory chip DRAM0, and the like to the active interposer A-IP in contrast to FIG. 4(a). In this case, the memory chip DRAM0, and the like become semiconductor chips (first semiconductor chip) on the transmission side, and the active interposer A-IP becomes a semiconductor chip (second semiconductor chip) on the reception side. Accordingly, the transmission CLK is transmitted from a side such as the memory chip DRAM0 to the active interposer A-IP side. In this case, as illustrated in FIG. 4(b), Tx38 for transmission CLK that is a transmission coil of the transmission CLK is provided on the memory chip DRAM0 and the like, and Rx39 for reception CLK that is a reception coil that receives the transmission CLK is provided on the active interposer A-IP. Transmission and reception of the transmission CLK therebetween are the same as in the operation described in FIG. 4(a).

In FIG. 4(b), in the case of transmitting the clock signal from each of the DRAM chips to the active interposer A-IP side, a timing of the transmission CLK generated in the DRAM chips is different in each case (between the DRAM chips), and thus the transmission CLK is individually transmitted, and the reception CLK is generated on the basis of the transmission CLK. Furthermore, the reason why the timing of the transmission CLK is different between the DRAM chips is because a process of the DRAM chips varies. Furthermore, as illustrated in FIG. 4(b), it is preferable that the Tx38 for transmission CLK and the Rx39 for reception CLK are provided in a pair. In addition, as illustrated in FIG. 4(a), it is also suitable that a plurality of pieces of the Rx37 for reception CLK are provided with respect to one piece of the Tx36 for transmission CLK.

Conclusion of Embodiment 1

(1) As described above, in Embodiment 1, in the case of transmitting and receiving data by using the TCI technology, two kinds of threshold values, which are values for identification of a value of the data, are used. It is possible to identify a state of a received signal (transmitted signal) in three kinds by using the two kinds of threshold values. As a result, for example, it is possible to identify three kinds of signals including "0", "1", and "2" by using one set of coils (the transmission coil 16 and the reception coil 18). Accordingly, it is possible to transmit a further many kinds of data in comparison to the conventional technology in which only two kinds of data including "0" and "1" can be transmitted by one set of coils, and thus in the same data amount (data width), it is possible to reduce the number of coils. In addition, a further large data amount (data width) can be transmitted and received in the same number of coils.

(2) In addition, in Embodiment 1, description has been given of an example in which three kinds of signal states (signal amplitudes) are identified by using two kinds of threshold values (Vth+ and Vth−), it is possible to employ a configuration in which a further many kinds of signal states are identified by using further many threshold values. For example, typically, n+1 kinds of signal states (amplitudes) can be identified by using n kinds of threshold values. Here, n is a natural number of two or greater. Accordingly, when using further many threshold values, it is possible to transmit and receive further many pieces of data while using the same number of coils.

Second. Embodiment 2

In Embodiment 1, description has been given of a technology capable of transmitting not only "0" and "1" but also three kinds of data "0", "1", and "2" by using one set of the transmission coil 16 and the reception coil 18. In Embodiment 2, description will be given of an example in which the above-described technology is applied to a plurality of sets of transmission coils and reception coils.

Configuration

Figure 5:
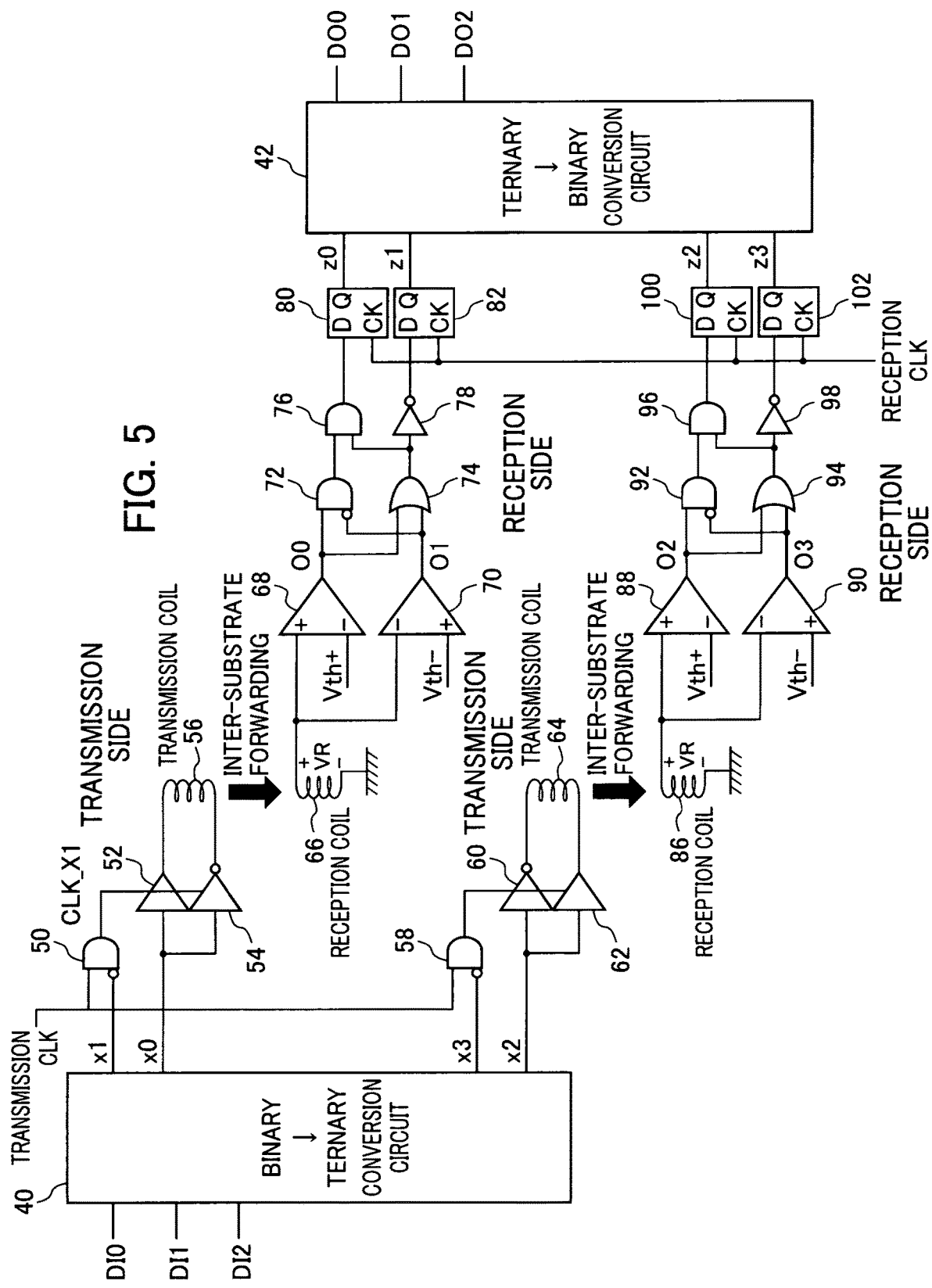
FIG. 5 is a configuration diagram illustrating a circuit configuration in which data transmission is performed between semiconductor chips by using the TCI technology in a layered semiconductor device according to Embodiment 2.

FIG. 5 is a configuration diagram illustrating a circuit configuration in which data transmission is performed between semiconductor chips in a layered semiconductor device of Embodiment 2. FIG. 5 corresponds to FIG. 1 of Embodiment 1. In FIG. 5, a transmission side represents a configuration of a semiconductor chip on a data transmission side, and a reception side represents a configuration of another semiconductor chip on a data reception side. In FIG. 5, a left portion is a transmission unit, and a left portion (excluding transmission coils 56 and 64) from the transmission coils 56 and 64 is the transmission unit. In addition, in FIG. 5, a right portion is a reception unit, and a right portion (excluding reception coils 66 and 86) from the reception coils 66 and 86 is the reception unit. The transmission unit and the reception unit in FIG. 5 corresponds to preferred example of a transmission unit and a reception unit in the appended claims, and as a circuit configuration, various configurations can be employed, and configurations of the transmission unit and the reception unit are not limited to configurations in FIG. 5.

Transmission Side

In FIG. 5, three pieces of data DI0, DI1, and DI2 are data to be transmitted. In Embodiment 2, the three pieces of data are binaries, and represent numbers in a range of "000" to "111". The numbers represent a numerical range of "0" to "7" in terms of a decimal number. In Embodiment 2, the data to be transmitted is converted into a ternary (binary-coded-ternary) by using a binary-ternary conversion circuit 40. A circuit diagram of the binary-ternary conversion circuit 40 is illustrated in FIG. 6(a), and a truth table thereof is illustrated in FIG. 6(b).

Figures 6A, 6B:
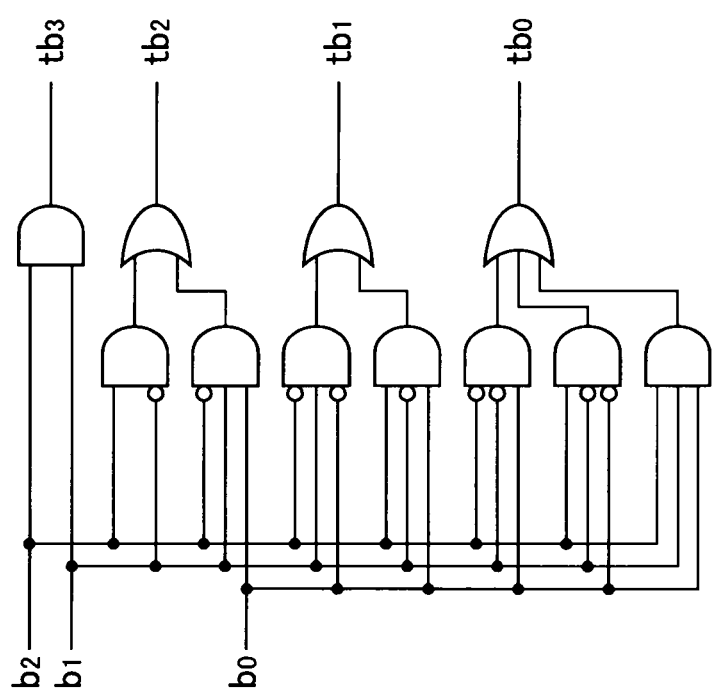
FIG. 6 is a circuit diagram of a binary-ternary conversion circuit 40 and a truth table thereof.

The circuit diagram of FIG. 6(a) is a preferred configuration example of the binary-ternary conversion circuit 40, but there is no limitation thereto.

b2, b1, and b0 in FIG. 6(a) are binaries which are input, and correspond to DI2, DI1, and DI0 in FIG. 5. In addition, tb3, tb2, tb1, and tb0 in FIG. 6(a) are binary-coded-ternaries which are output, and correspond to x3, x2, x1, and x0 in FIG. 5. The binary-coded ternaries represent two-digit ternaries, t1 that is a ternary in the truth table of FIG. 6(b) corresponds to tb3 and tb2, and tO that is a ternary corresponds to tb1 and tb0. In addition, in the truth table of FIG. 6(b), the binary, the ternary, and the binary-coded-ternary are illustrated in this order from the left side. Binaries b2, b1, and b0, and binary-coded-ternaries tb3, tb2, tb1, and tb0 in FIG. 6(a) are illustrated in the truth table.

Furthermore, a binary-coded-ternary expresses each digit of a ternary with a two-bit binary. For example, "12" of the ternary can be expressed as "01" and "10" when being expressed as the binary-coded-ternary (refer to FIG. 6(b)). When expressed by respective bases, this example is as follows:

| Decimal | "5" |
|---|---|
| Binary | "0101" |
| Ternary | "12" |
| Binary-coded-ternary | "0110". |

Each of output signals x1 and x0 of the binary-ternary conversion circuit 40 is a lower one digit of the binary-coded-ternary, and the output signals x1 and x0 represent "0", "1", and "2" by two bits thereof. Accordingly, a circuit that transmits the three kinds of data is the same as in Embodiment 1 (FIG. 1) and operates in the same manner. Data on the output signal x0 is input to a non-inverting transmission amplifier 52 and an inverting transmission amplifier 54. In addition, the transmission coil 56 is connected between an output terminal of the non-inverting transmission amplifier 52 and an output terminal of the inverting transmission amplifier 54. According to the configuration, a predetermined magnetic field is generated in the transmission coil 56, but an operation of the transmission coil 56 is the same as in Embodiment 1 (refer to FIG. 1, and the like). The output signal x1 and transmission CLK are input to an AND gate 50 in combination. Furthermore, data on the output signal x1 in input to the AND gate 50 after being inverted.

An output signal CLK_X1 of the AND gate 50 is a signal obtained by gating the data on the output signal x1 with the transmission CLK, and a signal in which data of the output signal x1 appears only in a case where the transmission CLK is "1". The CLK_X1 is supplied to the non-inverting transmission amplifier 52 and the inverting transmission amplifier 54, and the amplifiers operate as described above only in a case where the CLK_X1 is "1".

As described above, the transmission side (semiconductor chip thereof) includes the non-inverting transmission amplifier 52, the inverting transmission amplifier 54, the transmission coil 56, and the AND gate 50. According to the configuration, on the transmission side, in a case where the output signal x1 is "0", a current in a direction corresponding to a value of the output signal x0 flows to the transmission coil 56 in synchronization with the transmission CLK. A detailed operation is the same as in the operation described in Embodiment 1 with reference to FIG. 2.

Furthermore, with regard to x3 and x2 which are higher digits of the binary-coded-ternary, a circuit having the same configuration as in x1 and x0 is provided. That is, the transmission side is constituted by an AND gate 58, a non-inverting transmission amplifier 60, an inverting transmission amplifier 62, and a transmission coil 64, and an operation thereof is the same as in the above-described circuit. That is, in Embodiment 2, the higher digits and the lower digits of the binary-coded-ternary are transmitted to the reception side (semiconductor chip thereof) by completely the same configuration and operation.

Reception Side

First, description will be given of a portion related to transmission of x1 and x0. In FIG. 5, when a predetermined voltage of transmission signal is applied to the transmission coil 56 on the transmission side, the same reception signal VR (in an opposite direction) also appears in the reception coil 66 on the reception side due to magnetic field coupling (electromagnetic induction). In principle, the reception signal VR is a signal of a voltage which is equivalent to a voltage applied to the transmission coil 56 on the transmission side, and at least of which an amplitude is proportional to the voltage applied to the transmission coil 56.

The reception signal VR that appears in the reception coil 18 is input to a non-inverting input terminal of a sense amplifier 68 and an inverting input terminal of a sense amplifier 70. A predetermined threshold voltage Vth+ is applied to the inverting input terminal of the sense amplifier 68. In addition, a predetermined threshold voltage Vth− is applied to the non-inverting input terminal of the sense amplifier 70. The operation of the sense amplifiers 68 and 70 is the same as in Embodiment 1. An output O0 of the sense amplifier 68 is input to an AND gate 72 and an OR gate 74. An output O1 of the sense amplifier 70 is also input to the AND gate 72 and the OR gate 74. However, the output O1 of the sense amplifier 70 is input to the AND gate 72 after being inverted. An output of the AND gate 72 is input to an AND gate 76. On the other hand, an output of the OR gate 74 is input to the AND gate 76 and an inverter 78. An output signal of the AND gate 76 and an output signal of the inverter 78 substantially become received data, are latched by flip-flops 80 and 82, and are output as z0 and z1. According to the configuration, data of x0 and data of x1 on the transmission side are restored as z0 and z1 on the reception side. A configuration from the reception coil 66 to the flip-flops 80 and 82, and an operation of the configuration are the same as in Embodiment 1.

In Embodiment 2. The restored z0 and z1 are the same as x0 and x1 which are binary-coded ternaries on the transmission side. According to this, z0 and z1 are converted into a plurality of pieces of final reception data DO0, DO1, and DO2 by a ternary-binary conversion circuit 42. Furthermore, higher digits z3 and z2 of the binary-coded-ternary are also input to the ternary-binary conversion circuit 42, and the ternary-binary conversion circuit 42 restores a plurality of pieces of reception data DO0, DO1, and DO2 on the basis of all of z3, z2, z1, and z0.

Figures 7A, 7B:
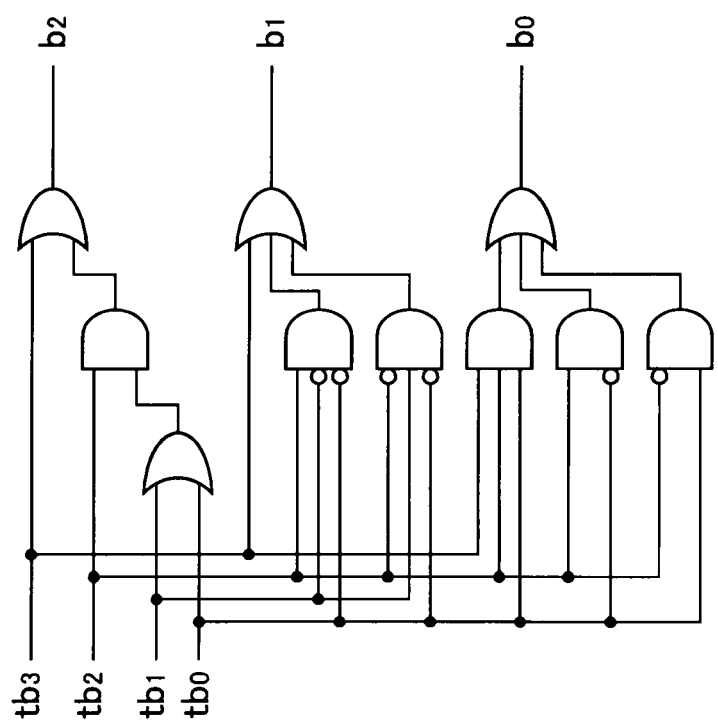
FIG. 7 is a circuit diagram of a ternary-binary conversion circuit 42 and a truth table thereof.

A circuit diagram of the ternary-binary conversion circuit 42 is illustrated in FIG. 7(*a*), and a truth table thereof is illustrated in FIG. 7(*b*). The circuit diagram of FIG. 7(*a*) is a preferred configuration example of the ternary-binary conversion circuit 42, but there is no limitation thereto.

tb3, tb2, tb1, and tb0 in FIG. 7(*a*) are binary-coded-ternaries which are input to the ternary-binary conversion circuit 42, and correspond to z3, z2, z1, and z0 in FIG. 5.

b2, b1, and b0 in FIG. 7(*a*) are binaries which are output, and correspond to DO2, DO1, and DO0 in FIG. 5. In addition, the truth table of FIG. 7(*b*) is a table in which vertical items in the truth table of FIG. 6(*b*) are substituted with each other, and the content thereof is the same as the truth table of FIG. 6(*b*). Each of the output signals x1 and x0 of the binary-ternary conversion circuit 40 is a lower one digit of the binary-coded-ternary, and the output signals x1 and x0 represent "0", "1", and "2" by two bits thereof. Accordingly, a circuit that transmits the three kinds of data is the same as in Embodiment 1 (FIG. 1) and operates in the same manner.

With regard to reception in a portion related to x3 and x2 which are higher digits of the binary-coded-ternary in FIG. 5, a configuration and an operation thereof are the same as in reception of x1 and x0 as described above. As is the case with x1 and x0, a reception signal VR that appears in the reception coil 86 is received by sense amplifiers 88 and 90, and are compared with the first threshold value Vth+ and the second threshold value Vth−. As in O0 and O1, output signals O2 and O3 of the sense amplifiers 88 and 90 are input to AND gate 92 and OR gate 94. Output signals of the AND gates 92 and the OR gate 94 are input to an AND gate 96 and an inverter 98. Output signals of the AND gate 96 and the inverter 98 are latched by flip-flops 100 and 102. The latched signals become z2 and z3, and are supplied to the ternary-binary conversion circuit 42.

As described above, z3, z2, z1, and z0 which are binary-coded-ternaries are input to the ternary-binary conversion circuit 42, and the ternary-binary conversion circuit 42 converts z3, z2, z1, and z0 into DO2, DO1, and DO0 which are binaries. As described above, a plurality of pieces of the same data as the data DI2, DI1, and DI0 to be transmitted are obtained (restored) as a plurality of pieces of reception data DO2, DO1, and DO0 in a semiconductor chip on the reception side.

Conclusion of Embodiment 2

As described above, in Embodiment 2, data transmission by three values instead of two values of "0" and "1" is performed by using a signal capable of taking three kinds of states (three kinds of amplitudes) as in Embodiment 1. When employing the transmission by the three values, it is possible to reduce the number of coils to ⅔ times. That is, in Embodiment 2, it is possible to perform transmission of three kinds of data (transmission of three-bit data) by using two sets of transmission coils and reception coils.

Accordingly, for example, in the case of transmitting data of 256 bits, the number of sets of the coils becomes ⅔ times the 256 bits, and it is possible to transmit data of 256 bits with 171 sets of transmission coils and reception coils. As described above, according to Embodiment 2, it is possible to reduce the number of coils to ⅔ times while using the TCI technology, and thus it is possible to reduce an area that is occupied by the coils on the semiconductor chips. As a result, it is possible to increase an area capable of being used as a circuit on the semiconductor chip. In contrast, in a case where the number of coils is set to be constant, it is possible to transmit a further many pieces of data in comparison to the conventional technology (data of a bit number that is greater in comparison to the conventional technology).

Third. Modification Example (1) In the embodiments, description has been given of an example in which the number of states which a signal can take is set to three kinds, and the three kinds of (three kinds of amplitudes of) data is transmitted and received. However, it is also suitable that transmission and reception of multi-value data is performed by using a transmission signal or a magnetic field signal in a further many kinds of states (amplitudes). In the embodiments, the three kinds of states (amplitudes) of the transmission signal or the magnetic field signal are identified by using two threshold values (the first threshold value and the second threshold value). However, typically, it is also suitable that n+1 kinds of states are identified by using n threshold values. In this case, since n+1 kinds of a signal can be identified, it is possible to perform transmission and reception of data of n+1 values.

(2) In the embodiments, description has been mainly given of a case where the semiconductor chip on the transmission side and the semiconductor chip on the reception side form a pair. However, as described in FIG. 4 and the like, even in a case where one semiconductor chip exists on the transmission side, and a plurality of the semiconductor chips exist on the reception side, it is possible to perform transmission and reception of three-value data (or multi-value data) through application of the principle of the invention. In FIG. 4, the clock signal transmission operation is described, but this is also true of data transmission. In addition, in the embodiments, description has been given of an example in which the semiconductor chip on the transmission side performs only transmission, and the semiconductor chip on the reception side performs only reception, but it is also suitable that a circuit configuration for transmission and a circuit configuration for reception are provided on one semiconductor chip. According to this configuration, it is possible to perform bidirectional data transmission.

(3) In the embodiments, description has been given of a data transmission technology between semiconductor chips in a layered semiconductor device having a configuration in which a plurality of semiconductor chips are stacked. The semiconductor chips may be arbitrary semiconductor chips. As described in the example of FIG. 4, each of the semiconductor chips may be a memory chip, an active interposer A-I/P, or a simple interposer I/P.

Hereinbefore, embodiments of the invention have been described in detail, but it should be understand that the above-described embodiments illustrate only specific examples for carrying out the invention. The technical range of the invention is not limited by the above-described embodiments. Various modifications can be made within a range not departing from the gist of the invention, and the modifications are also included in the technical range of the invention.

EXPLANATION OF REFERENCE NUMERALS 10, 24, 28, 50, 58, 72, 76, 92, 96 AND GATE
12, 52, 58, 200 NON-INVERTING TRANSMISSION AMPLIFIER
14, 54, 62, 202 INVERTING TRANSMISSION AMPLIFIER
16, 56, 64, 204 TRANSMISSION COIL
17 MAGNETIC FIELD SIGNAL
18, 66, 86, 206 RECEPTION COIL
19 RECEPTION SIGNAL VR
20, 22, 68, 70, 88, 90, 208 SENSE AMPLIFIER
26, 74, 94 OR GATE
30, 78, 98 INVERTER
32, 34, 80, 82, 100, 102, 210 FLIP-FLOP
36, 38 Tx FOR TRANSMISSION CLK
37, 39 Rx FOR RECEPTION CLK
40 BINARY-TERNARY CONVERSION CIRCUIT
42 TERNARY-TERNARY CONVERSION CIRCUIT
DI, DI0, DI1, DI2 DATA (DATA TO BE TRANSMITTED)
DO, DO0, DO1, DO2 DATA (RECEPTION DATA)
Vth+ FIRST THRESHOLD VALUE
Vth− SECOND THRESHOLD VALUE

The invention claimed is:

1. A layered semiconductor device in which at least
a first semiconductor chip that transmits data in a contactless manner; and
a second semiconductor chip that receives the transmitted data in a contactless manner are stacked,
wherein the first semiconductor chip includes:
a transmission unit that outputs a transmission signal capable of taking at least three or more kinds of states indicating a value of data on a basis of the value of data to be transmitted; and
a transmission coil that converts the transmission signal into a magnetic field signal,
wherein the second semiconductor chip includes:
a reception coil that converts the magnetic field signal converted by the transmission coil into a reception signal; and
a reception unit that restores the transmitted data on a basis of a state of the reception signal,
wherein the transmission unit outputs the transmission signal having three or more kinds of amplitude values on a basis of the value of data to be transmitted,
wherein the transmission coil converts the transmission signal into a magnetic field signal of three or more kinds of amplitudes based on the value of data,
wherein the reception coil converts the magnetic field signal into a reception signal of three or more kinds of amplitudes based on the value of data,
wherein the reception unit restores the value of transmitted data on a basis of an amplitude value of the reception signal,
wherein the transmission unit outputs the transmission signal so that the amplitude value of the reception signal becomes greater than a first threshold value in the reception unit in a case where the data to be transmitted is data of a first value, outputs the transmission signal so that the amplitude value of the reception signal becomes equal to or less than the first threshold value and becomes equal to or greater than a second threshold value that is less than the first threshold value in the reception unit in a case where the data to be transmitted is data of a second value, and outputs the transmission signal so that the amplitude value of the reception signal becomes less than the second threshold value in the reception unit in a case where the data to be transmitted is data of a third value, and wherein a direction of a magnetic field signal where the data to be transmitted is data of the first value is opposite to a direction of the magnetic field signal where the data to be transmitted is data of the third value.

2. The layered semiconductor device according to claim 1, wherein the reception unit includes:
a first comparison unit that compares the amplitude value of the reception signal and the first threshold value with each other;
a second comparison unit that compares the amplitude value of the reception signal and the second threshold value with each other; and
a data restoration unit that outputs the data of the first value in a case where the first comparison unit determines that the amplitude value of the reception signal is greater than the first threshold value, outputs the data of the second value in a case where the first comparison unit determines that the amplitude value of the reception signal is equal to or less than the first threshold value and the second comparison unit determines that the amplitude value of the reception signal is equal to or greater than the second threshold value, and outputs the data of the third value in a case where the second comparison unit determines that the amplitude value of the reception signal is less than the second threshold value.

3. A data communication method of transmitting data from a first semiconductor chip to a second semiconductor chip in a contactless manner in a layered semiconductor device in which at least the first semiconductor chip that transmits data in a contactless manner, and the second semiconductor chip that receives the transmitted data in a contactless manner are stacked, the method comprising:
an output step of outputting a transmission signal capable of taking at least three or more kinds of states indicating a value of data on a basis of the value of data to be transmitted in the first semiconductor chip;
a first conversion step of converting the transmission signal into a magnetic field signal in the first semiconductor chip;
a second conversion step of converting the converted magnetic field signal into a reception signal in the second semiconductor chip; and
a restoration step of restoring the transmitted data on a basis of a state of the reception signal in the second semiconductor chip,
wherein the transmission signal having three or more kinds of amplitude values is output on a basis of the value of data to be transmitted in the output step,
wherein the transmission signal is converted into a magnetic field signal of three or more kinds of amplitudes based on the value of data in the first conversion step, wherein the magnetic field signal is converted into a reception signal of three or more kinds of amplitudes based on the value of data in the second conversion step, and
wherein the value of transmitted data is restored on a basis of an amplitude value of the reception signal in the restoration step,
wherein in the output step, in a case where the data to be transmitted is data of a first value, the transmission signal is output so that the amplitude value of the reception signal becomes greater than a first threshold value in the restoration step, in a case where the data to be transmitted is data of a second value, the transmission signal is output so that the amplitude value of the reception signal becomes equal to or less than the first threshold value and becomes equal to or greater than a second threshold value that is less than the first threshold value in the restoration step, and in a case where the data to be transmitted is data of a third value, the transmission signal is output so that the amplitude value of the reception signal becomes less than the second threshold value in the restoration step, and
wherein a direction of a magnetic field signal where the data to be transmitted is data of the first value is opposite to a direction of the magnetic field signal where the data to be transmitted is data of the third value.

4. The data communication method according to claim 3, wherein the restoration step includes:
a first comparison step of comparing the amplitude value of the reception signal and the first threshold value with each other;
a second comparison step of comparing the amplitude value of the reception signal and the second threshold value with each other; and
a data restoration step of outputting the data of the first value in a case where it is determined that the amplitude value of the reception signal is greater than the first threshold value in the first comparison step, outputting the data of the second value in a case where it is determined that the amplitude value of the reception signal is equal to or less than the first threshold value in the first comparison step and it is determined that the amplitude value of the reception signal is equal to or greater than the second threshold value in the second comparison step, and outputting the data of the third value in a case where it is determined that the amplitude value of the reception signal is less than the second threshold value in the second comparison step.

5. The layered semiconductor device according to claim 1, wherein the data to be transmitted is data of the second value, the magnetic field signal is not transmitted.

6. The data communication method according to claim 3, wherein the data to be transmitted is data of the second value, the magnetic field signal is not transmitted.

* * * * *